United States Patent [19]
Carrigan

[11] 4,345,365
[45] Aug. 24, 1982

[54] METHOD FOR FABRICATING AN INTEGRATED CIRCUIT

[75] Inventor: Donald G. Carrigan, Colorado Springs, Colo.

[73] Assignee: NCR Corporation, Dayton, Ohio

[21] Appl. No.: 194,658

[22] Filed: Oct. 6, 1980

[51] Int. Cl.³ .......................................... H01L 21/22
[52] U.S. Cl. .................... 29/571; 29/577 C; 29/591; 148/187
[58] Field of Search ............... 29/577 C, 591, 571; 148/187

[56] References Cited

U.S. PATENT DOCUMENTS

| | | | |
|---|---|---|---|
| 3,943,543 | 3/1976 | Caywood | 357/24 |
| 4,076,557 | 2/1978 | Huang et al. | 148/1.5 |
| 4,077,112 | 3/1978 | Theunissen et al. | 29/580 |
| 4,112,575 | 9/1978 | Fu et al. | 29/577 C |
| 4,179,793 | 12/1979 | Hagiwara | 29/578 |
| 4,193,183 | 3/1980 | Klein | 29/578 |
| 4,276,099 | 6/1981 | Keen | 148/1.5 X |
| 4,290,187 | 9/1981 | Stein | 148/1.5 X |

OTHER PUBLICATIONS

Bertram et al, "A Three-Level Metallization Three-Phase CCD," *IEEE Trans. on Electron Devices*, vol. ED-21, No. 12, Dec. 1974, pp. 758-767.

*Primary Examiner*—G. Ozaki
*Attorney, Agent, or Firm*—J. T. Cavender

[57] ABSTRACT

This invention pertains to an improved multilevel integrated circuit wherein a single layer of metal or other conductive material is used for interconnection and formation of the conductors and/or gate electrodes of one of the conductor layers. The multilevel integrated circuit of the present invention also includes a thick interlayer insulator which is located between this conductor/interconnect layer and the underlying substrate and lower level conductors to electrically isolate this layer of metal therefrom. The interlayer insulator is not required in the channel region of charge-coupled circuits.

5 Claims, 35 Drawing Figures

METHOD FOR FABRICATING AN INTEGRATED CIRCUIT

BACKGROUND OF THE INVENTION

This invention relates in general to integrated circuit devices having a multilevel configuration and, more particularly, to an improvement in such devices which greatly simplifies the design and fabrication thereof.

Multilevel integrated circuits are normally arranged to have one or more layers of conductive material which are formed into conductor and/or gate electrodes and an additional layer of metal for interconnect purposes. In such circuits, the layer of interconnect metal is distinct from the lower layers of conductive material and is separated from each of these lower layers of conductive material by a layer of insulating material. Accordingly, these prior art devices are typically arranged to have a separate conductor layer for each lower level of conductors and/or gate electrodes and an additional conductor layer for interconnect purposes.

It is an object of the present invention to provide a multilevel device wherein a single "conductor/interconnect layer" is used for interconnections and for gate electrodes and other conductors.

A further object of the present invention is to provide a multilevel device wherein a thick interlayer insulator is selectively located between the metal of the conductor/interconnect layer and the underlying substrate and lower level conductor layers to thereby isolate this layer of metal from the substrate and lower level conductor layers.

It is an additional object of the present invention to provide a method for fabricating a multilevel device of the character described herein.

Other objects of the invention, together with the features and novelty of the invention, will appear in the course of the following description.

SUMMARY OF THE INVENTION

The multilevel configuration disclosed herein represents a significant improvement over the conventional configuration described above. In particular, the subject invention discloses an improved configuration for multilevel devices wherein a single conductor/interconnect layer of metal forms conductors, such as gate electrodes, and interconnects, such as between conductors or between conductors and the substrate. The improved arrangement of the subject invention greatly simplifies the design and fabrication of the subject device by eliminating one layer of metal or polysilicon and the fabrication steps needed to form this conductor layer.

In implementing the multilevel configuration of the present invention, practical layout often necessitates that the metal of the conductor/interconnect layer be routed over the underlying substrate and/or lower level conductor layers. This proximity of the metal of the conductor/interconnect layer to the underlying substrate and lower level conductors can cause capacitive coupling. Capacitive coupling causes numerous operating problems which significantly degrade the overall circuit operation. To avoid these problems, the multilevel configuration of the present invention includes a thick layer of interlayer insulator which electrically isolates the conductor/interconnect layer from the underlying substrate and lower level conductor layer(s).

The fabrication technique of the present invention includes the steps of initially forming substrate impurity regions, such as sources and drains, and all conductor layers except the uppermost, conductor/interconnect layer. Thereafter, the thick interlayer insulator layer is deposited over the substrate and the previously-formed conductor layers. The interlayer insulator layer is then selectively etched to provide windows where the conductor/interconnect layer is to be formed into gate electrodes. This etching step is easily implemented because the tolerances for the mask pattern are not difficult to achieve. Contact holes to the implanted regions and lower level conductors are also made. Thereafter, a final layer of metal is deposited and formed to provide the conductors and/or gate electrodes corresponding to the uppermost conductor layer and the desired interconnect pattern.

DETAILED DESCRIPTION OF THE INVENTION

Figure 1:
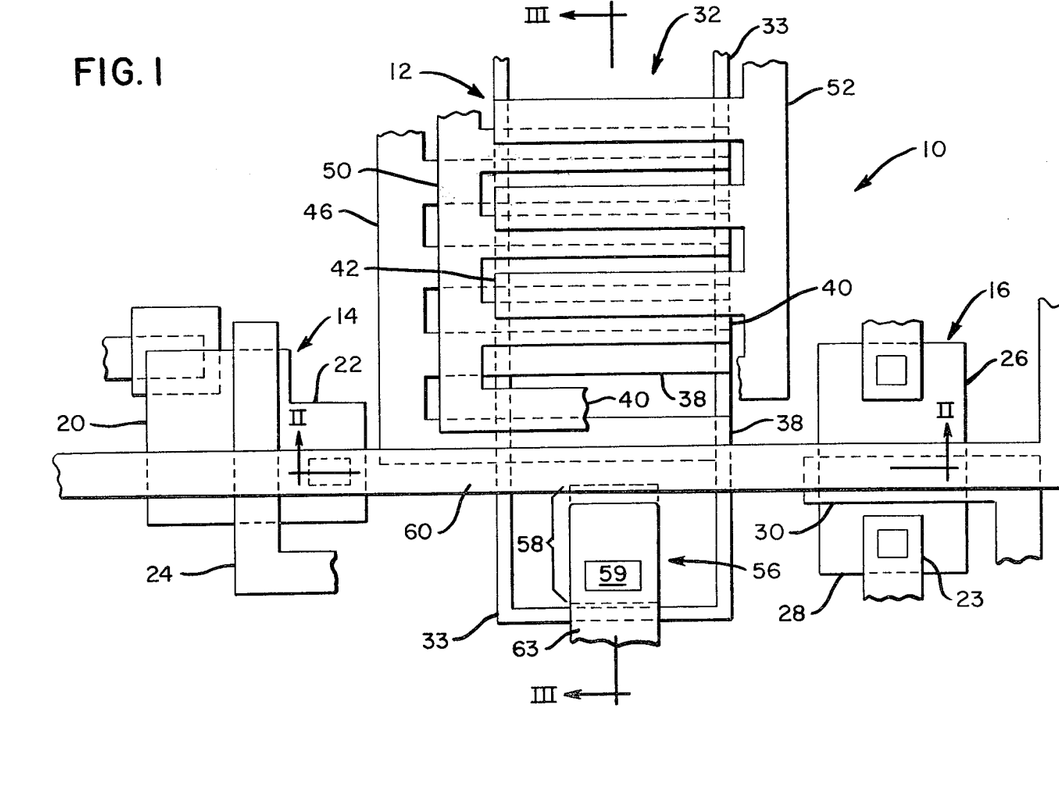
FIG. 1 is a top plan view of an integrated circuit illustrating the inventive features of the present invention.
Figure 2:
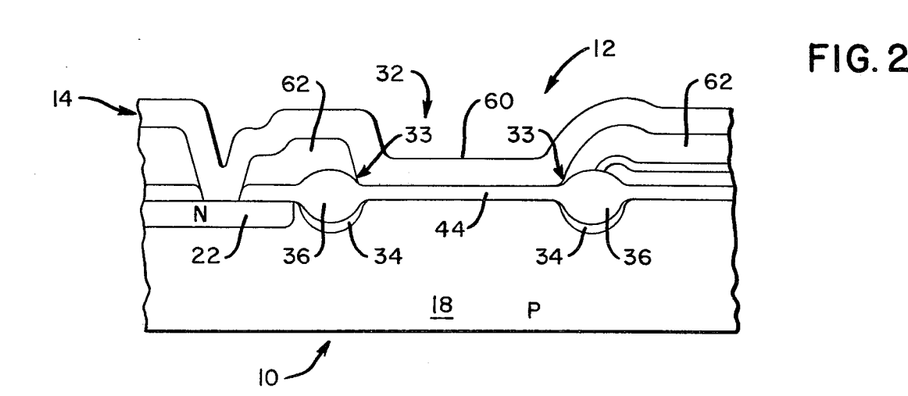
FIG. 2 is an enlarged sectional view taken along the line II—II of FIG. 1.
Figure 3:
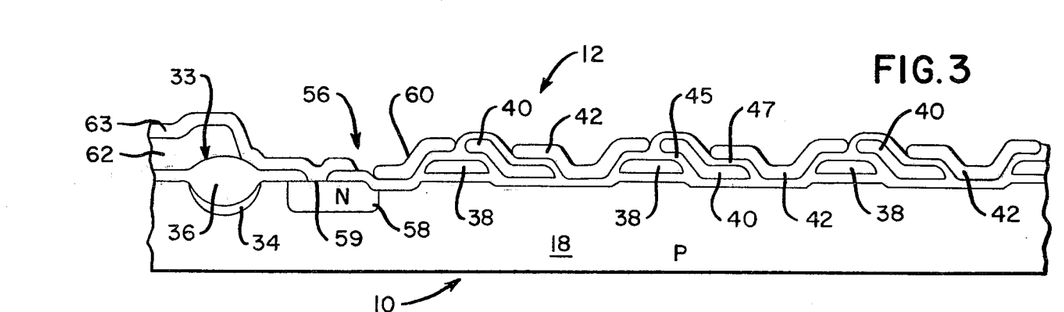
FIG. 3 is an enlarged sectional view taken alone line III—III of FIG. 1.

Reference is now made to FIGS. 1, 2 and 3 wherein a portion of an integrated circuit which is constructed in accordance with the teachings of the present invention is generally designated by the numeral 10. This integrated circuit is of an arbitrary design which was selected to clearly illustrate the principles of the present invention. While the following description is principally directed to the fabrication of an integrated circuit which includes a charge-coupled device, the description is exemplary of the fabrication of a class of devices comprising multilevel integrated circuits wherein a single layer of metal is used for interconnections and formation of gate electrodes. In addition, it should be noted that the thickness and other dimensions shown herein are selected for clarity of illustration and are not to be interpreted in a limiting sense. The dimensions set forth herein can be smaller or larger depending upon the operating environment in which the device is going to be used. In this regard, it should be pointed out that the thrust of microelectronics technology is toward smaller dimensions and greater device density.

Circuit 10 includes a three-phase, three-level charge-coupled device (CCD) circuit designated by the numeral 12, and a pair of peripheral transistors designated by the numerals 14 and 16. Circuit 10 is shown as being formed on a p-type silicon substrate 18. The substrate can also be comprised of n-type silicon or other semiconductor materials which are well-known to those familiar with the art.

Peripheral transistor 14 includes a pair of N-type impurity regions 20 and 22 which are diffused or implanted into the substrate to form the source and drain regions of the transistor. Transistor 14 also includes a gate electrode 24 formed by a lower level layer of polysilicon which is appropriately doped to provide high conductivity. Peripheral transistor 16, like transistor 14, includes a pair of impurity regions 26 and 28 which are diffused or implanted into the semiconductor substrate to form the source and drain, which pair are electrically connected to other circuit devices through electrodes such as 23, and a gate electrode 30 which is formed by a lower level layer of polysilicon.

Referring further to FIGS. 1, 2 and 3, CCD circuit 12 includes a channel region 32 which is defined by a field isolation barrier 33. Barrier 33 comprises an implanted region 34 (p+ for p type substrate 18) and an oxide barrier 36. CCD circuit 12 also comprises a plurality of first level gate electrodes 38, a plurality of second level gate electrodes 40 and a plurality of third level gate electrodes 42. These electrodes are formed on an oxide layer 44 (which is part of layer 126) to provide a linear array of MOS capacitors which are operable to serially propagate charge packets, representing information, along the channel region 32.

The electrodes 38 which comprise the first level of electrodes have a generally trapezoidal cross-section and are connected to a first phase bus 46 (FIG. 1). The first level gate electrodes 38 are spaced apart from each other and extend across the channel region 32 in parallel relationship. The first level gate electrodes 38 are formed from a first layer of polysilicon which is deposited over the oxide layer 44 and is then patterned to form the first phase bus 46 and other lower level electrodes, such as the gate electrode 24 of transistor 14 and gate electrode 30 of transistor 16, in addition to the electrodes 38.

The second level gate electrodes 40 are in spaced-apart, parallel relationship and extend across channel region 32 from a second phase bus 50. The second level gate electrodes 40 are constructed to have a generally slanted Z-shaped or slanted S-shaped cross-section depending upon the viewing perspective (Z-shaped in FIG. 3 perspective) and are arranged such that the upper horizontal portion of each overlaps a portion of its adjacent first level electrode 38. The second level gate electrodes 40 are formed in a manner to be described in greater detail below.

The third level gate electrodes 42 are in spaced-apart parallel relationship and extend across channel region 32 from a third phase bus 52. The third level electrodes 42 are constructed to have a generally U-shaped cross-section and are positioned such that elongated, horizontally-extending upper portions of each electrode overlap a portion of an adjacent second level gate electrode at one side of the "U" and a portion of an adjacent first level gate electrode at the opposite side, as shown in FIG. 3. In this way, the first, second and third level gate electrodes are arranged in a regularly repeating sequence comprising a first level gate electrode 38, a second level gate electrode 40, and a third level gate electrode 42. The third level gate electrodes are formed in a manner to be described in greater detail hereinafter. This third level of electrodes is formed of the same conductive material as the circuit interconnect generally and, preferably, of metal.

As shown best in FIG. 3, the electrodes of each level are separated from each other by oxide layers. In particular, the first level electrodes 38 are separated from their adjacent second and third level electrodes 40 and 42 by an oxide layer 45, and the second level electrodes 40 are separated from their adjacent third level electrodes 42 by an oxide layer 47.

Referring to FIGS. 1 and 3, charge-coupled device circuit 12 is also provided with a conventional input circuit 56 for controllably injecting a desired level of charge into the transfer array comprised of the first, second and third level gate electrodes. Input circuit 56 comprises a source 58, an input gate 60, and conductor 63. The source 58 is an n+ impurity region which typically is implanted into the semiconductor substrate in a spaced-apart relationship to the first one of the electrodes 38 of the transfer array. Conductor 63 is provided to apply a voltage potential to source 58 using the contact cut at 59. Input gate 60 is a conductor which is formed over, and spans the space between, the source 58 and the first electrode of the transfer array. Application of suitable voltage potentials to gate 60 and conductor 63 transfers charges from source 58 to the first gate electrode 38, then voltages applied sequentially to the three gate electrode levels transfer the charges along channel 32.

The input gate 60, the conductor 63, the third level gate electrodes 42 and the third phase bus 52 are fabricated from a single conductive layer. This layer and/or the components formed therefrom are collectively referred to herein as the conductor/interconnect layer. This conductor/interconnect layer is formed in a manner to be described in greater detail below.

A thick interlayer insulator 62 is used to electrically isolate the conductor/interconnect layer from the underlying substrate 18 and lower level electrodes such as 38 and 40. Layer 62 is located between the conductor-/interconnect layer and the underlying substrate and lower level conductor layers everywhere, except where the conductor/interconnect layer (1) is connected to a substrate impurity region, (2) is connected to a lower level conductor or a lower level gate electrode, or (3) is used to form gate structures such as the third level gate electrodes 42 and input gate 60. The interlayer insulator typically comprises dielectric material which is deposited onto the substrate to a thickness sufficient to preclude tunneling, to prevent inversion of the underlying substrate, and to electrically isolate the conductor/interconnect layer from the underlying substrate and lower level conductor layers.

Figure 4A:
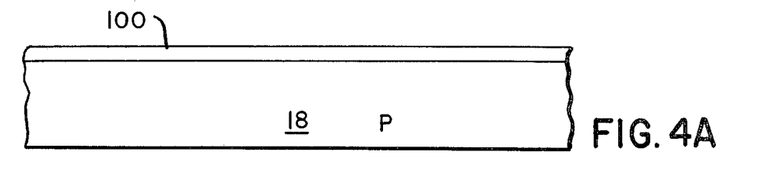
FIGS. 4A-P are sectional views along line II—II of FIG. 1 at various stages of the fabrication process.
Figure 4B:
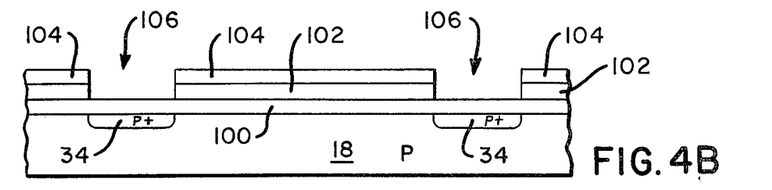
Figure 4C:
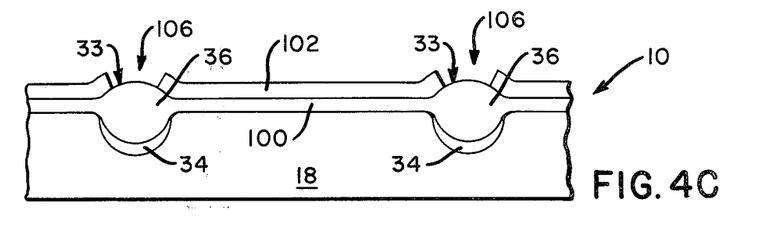
Figure 4D:
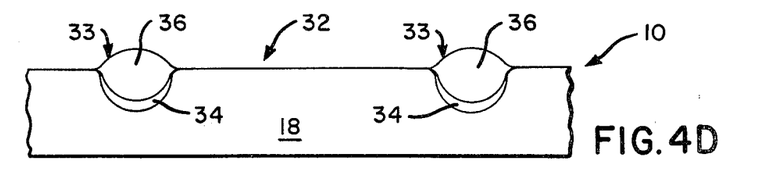
Figure 4E:
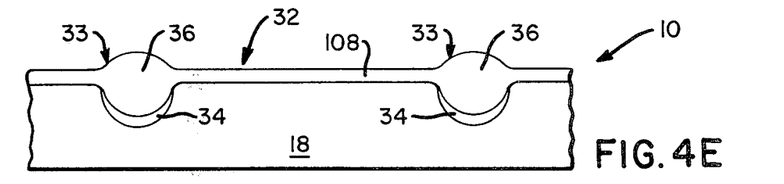
Figure 4F:
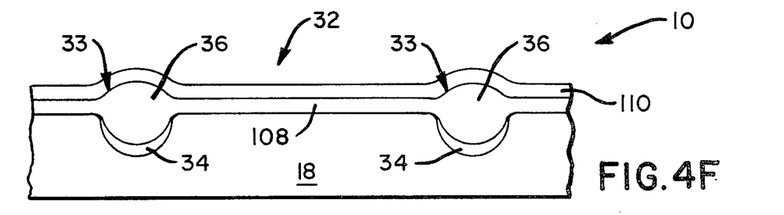
Figure 4G:
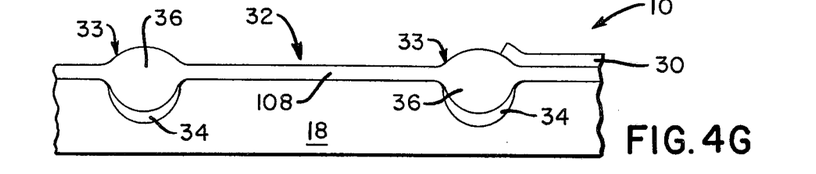
Figure 4H:
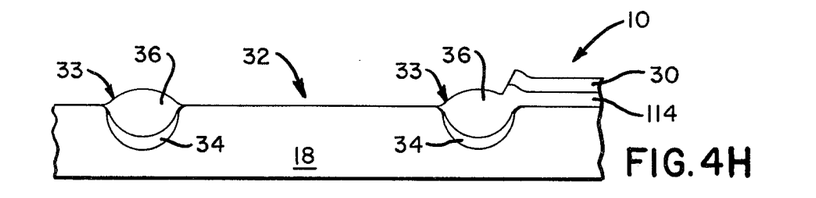
Figure 4I:
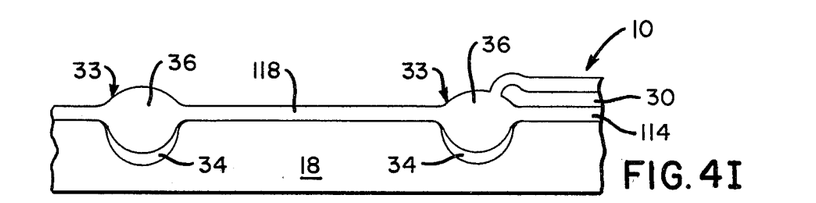
Figure 4J:
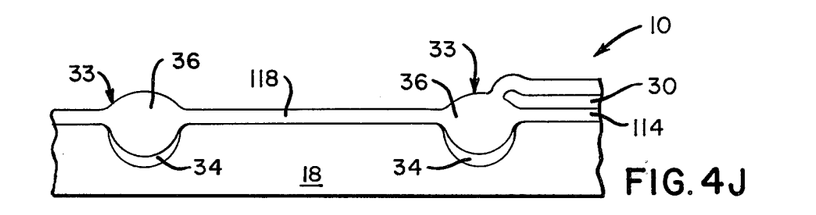
Figure 4K:
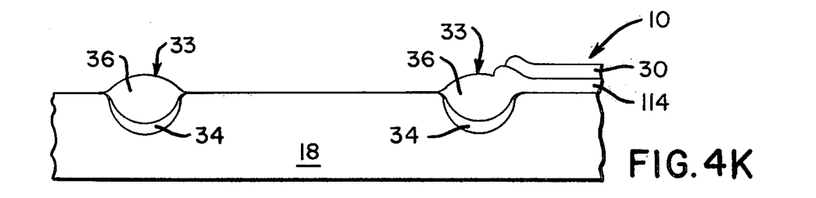
Figure 4L:
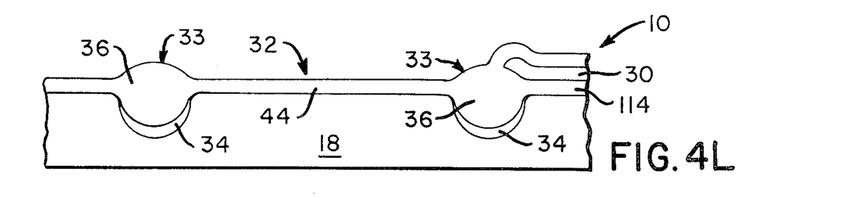
Figure 4M:
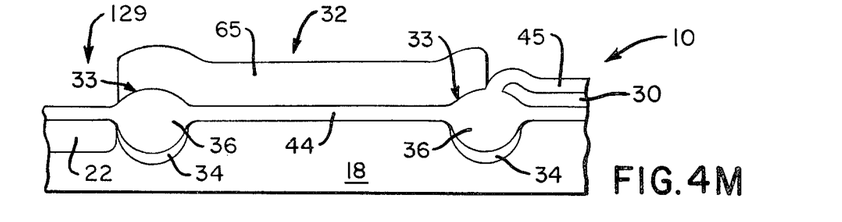
Figure 4N:
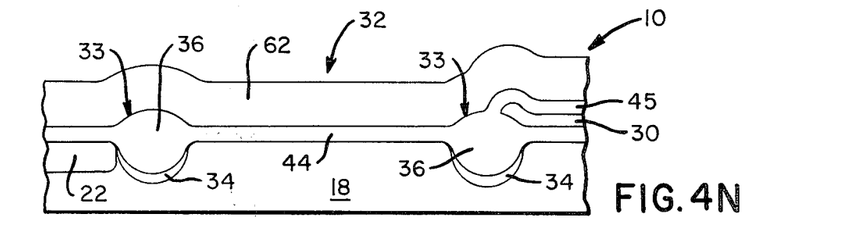
Figure 4O:
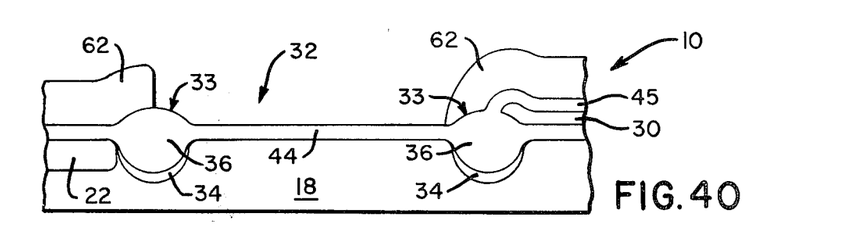
Figure 4P:
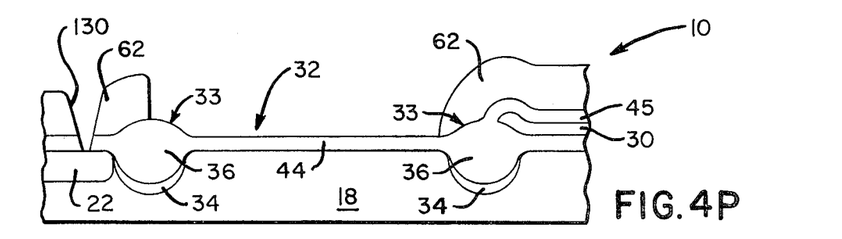
Figure 5A:
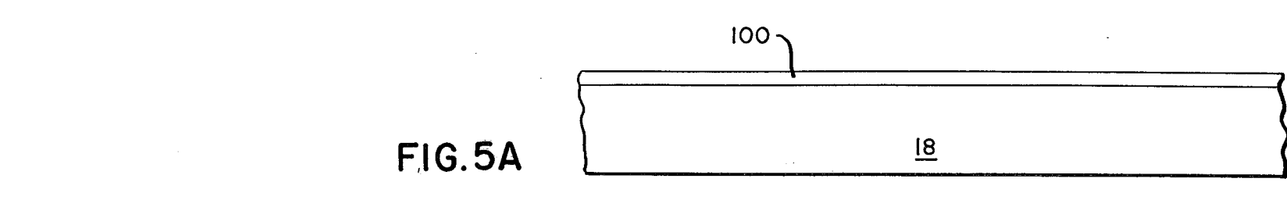
FIGS. 5A-P are sectional views taken along line III—III in FIG. 1 at various stages of the fabrication process.

FIGS. 4A-P and 5A-P illustrate the major steps of a method for fabricating device 10 in accordance with the teachings of this invention. When viewing these drawings, it should be noted that corresponding figures illustrate the same fabrication steps from different perspectives. For example, FIG. 4A and FIG. 5A show the same fabrication step of the process from the perspective, respectively, of line II—II of FIG. 1 and line III—III of FIG. 1. Similarly, FIG. 4B corresponds to FIG. 5B, and so on. The specific process techniques for implementing the various steps of the fabrication method are well-known in the art and may be implemented in a number of different ways which are readily apparent to those skilled in the art.

Figure 5B:
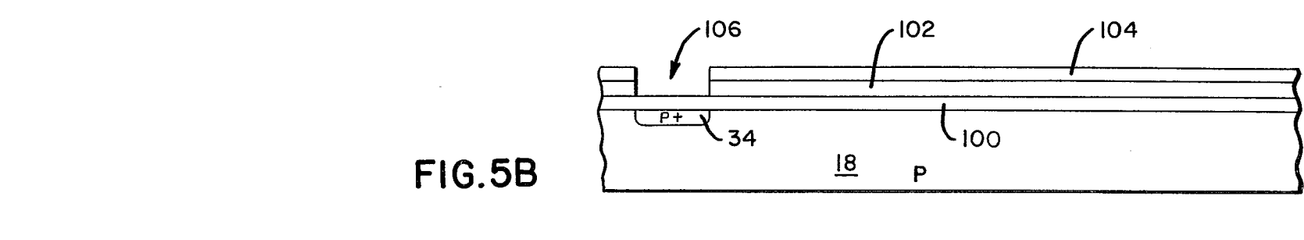

The first step of the fabrication process is the formation of channel region 32. The channel region 32 is formed by initially growing a thin layer of oxide 100 on the surface of the substrate 18 as shown in FIGS. 4A and 5A. Then, a layer of silicon nitride 102 is deposited onto the oxide layer 100. This is followed by the formation of a layer of photoresist 104 over the silicon nitride layer 102. The photoresist and nitride layers are then patterned using conventional photolithographic techniques to provide a mask window or channel 106 for forming the isolation barrier 33 which bounds channel region 32. Once the mask window 106 has been formed, p-type ions (such as boron) are implanted into the p-type substrate through the mask channel 106 to form implanted region 34 about the periphery of the channel 32. The resulting structure is shown in FIGS. 4B and 5B.

Figure 5C:
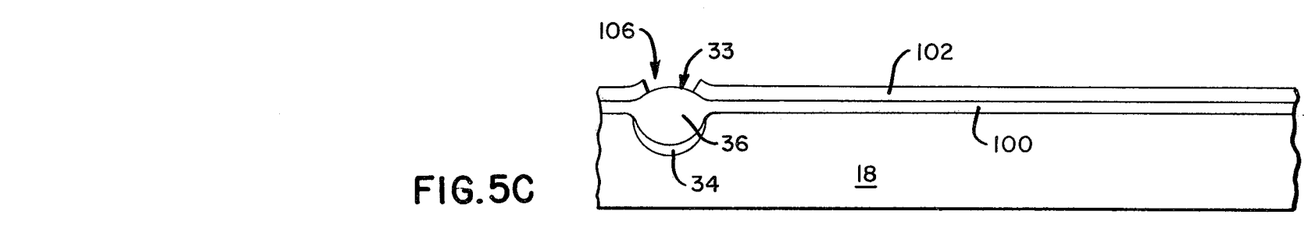
Figure 5D:
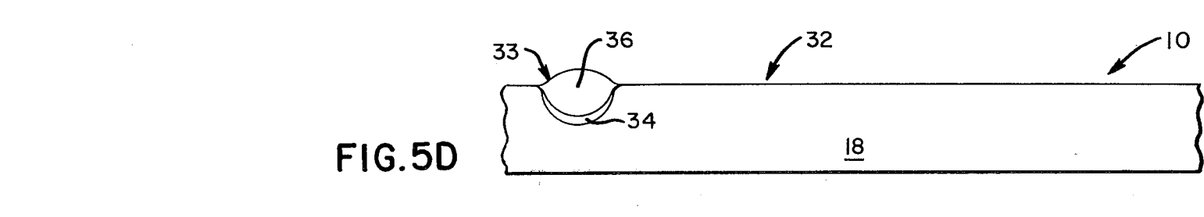

Next, oxide barrier 36 is formed via the mask channel 106 over the implanted region 34. As shown in FIGS. 4C and 5C, oxide barrier 36 can be formed by initially removing the layer of photoresist material 104 and then thermally oxidizing the substrate via the nitride mask channel 106 to form the layer of oxide 36 to a thickness of 8,000–12,000 Angstroms (0.8–1.2 microns). The layer of silicon nitride 102 and the layer of oxide 100 are then removed leaving only the field isolation barrier 33 (FIGS. 4D and 5D), which comprises p+ peripheral region 34 and the overlying oxide 36.

Figure 5E:
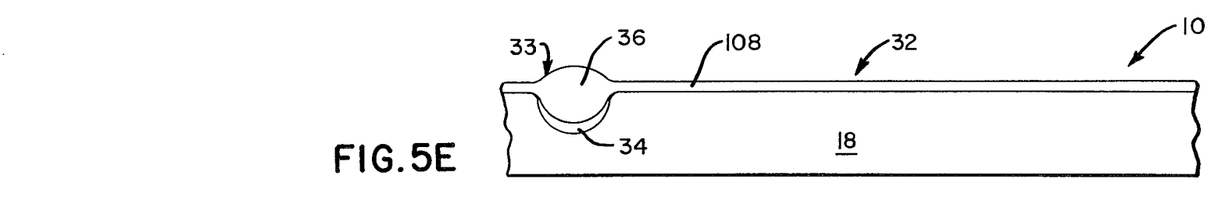
Figure 5F:
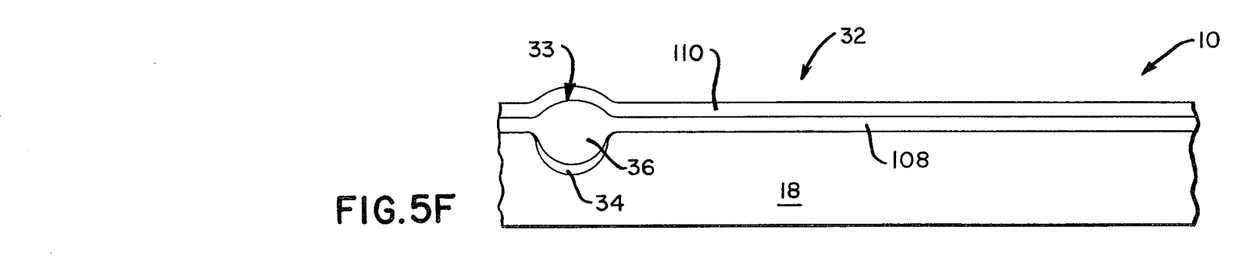
Figure 5G:
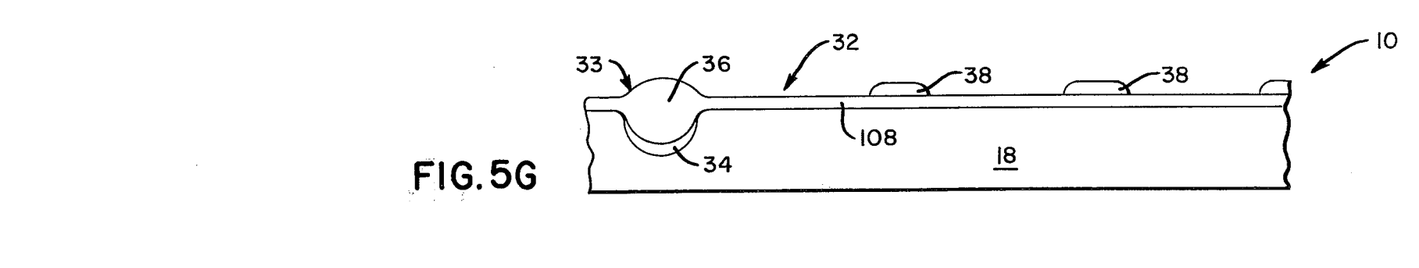

Once the field isolation barrier 33 has been formed, an oxide layer 108 is thermally grown on the substrate 18 to a thickness of approximately 500–1000 Angstroms (0.05–0.1 microns) in the channel region 32. The oxidation also increases the thickness of the oxide barrier layer 36. This step is illustrated in FIGS. 4E and 5E.

Figures 5H, 5I:
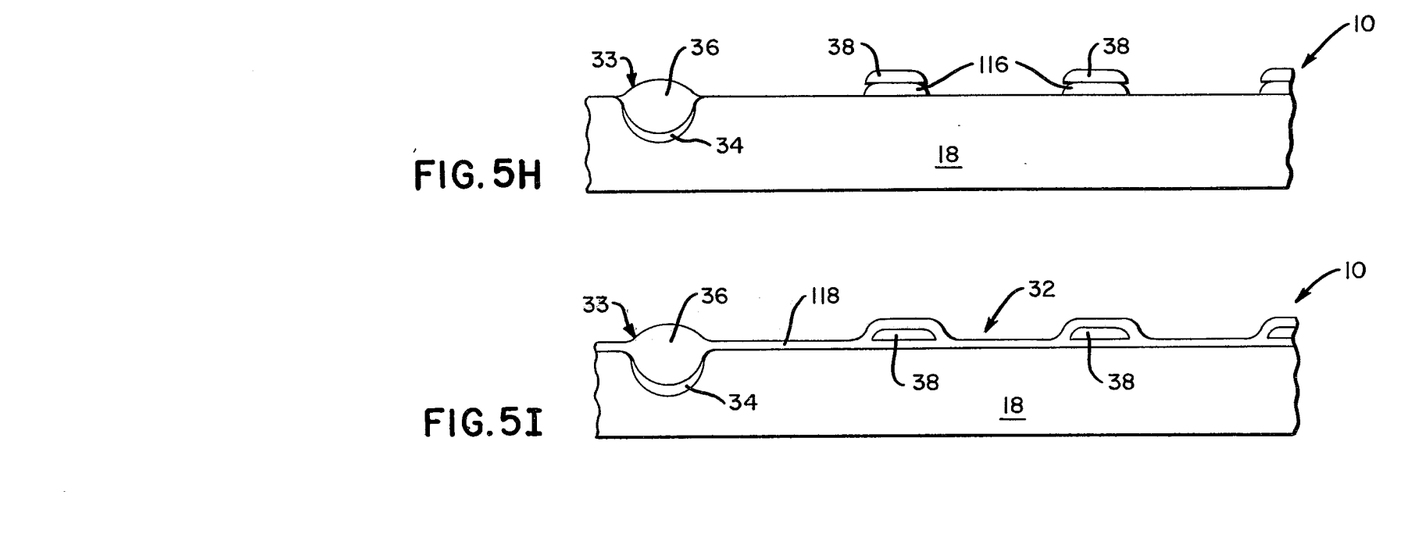

The next step of the fabrication process is to form the first level conductors, including gate electrodes 38 and transistor gate electrodes 24 and 30. This is done by depositing onto oxide layer 108 a layer of polycrystalline silicon 110 (polysilicon) which is appropriately doped to provide a high conductivity electrical conductor. This first level polysilicon conductor layer 110 is typically between 3000 and 8000 Angstroms (0.3–0.8 microns) thick. Layer 110 of first level polysilicon is then patterned, using conventional photolithographic techniques, into the first level gate electrodes 38 (FIG. 5G) and other first level conductors such as 30 (FIG. 4G). Next, the exposed portion of the gate oxide, that is layer 108, that is not covered at this time by the patterned polysilicon layer 110 is removed or "dipped out", as shown in FIGS. 4H and 5H, leaving a layer of oxide under each of the first level conductors. For example, oxide 114 remains beneath conductor 30 as shown in FIG. 4H. Similarly, and referring to FIG. 5H, oxide strips 116 are formed beneath the first level gate electrodes 38. It should be noted that oxide barrier 36 remains even after this oxide removal, because the original thickness of the barrier 36 is much greater than the thickness of the oxide 108 removed.

Then, using conventional techniques, the upper surface of patterned polysilicon layer 110 is converted to a layer of silicon oxide 118 to provide the insulated polysilicon structure shown in FIGS. 4I and 5I. This step of the process uses conventional processing techniques to grow oxide 118 on the semiconductor substrate to a thickness of 750–1000 Angstroms (0.075–0.1 microns). It should be noted that the portions of layer 118 formed over the polysilicon 110 will form at a higher oxidation rate, and will be about 30 percent thicker, than those portions which form from the bulk silicon surface. Oxide layer 118 combines with the oxide, such as 114, which is located beneath each of the first level conductors, such as 30 (FIG. 4H), with the islands of oxide 116 which are located beneath each of the first level electrodes 38 (FIG. 5H), and with isolation oxide 36 to provide a single continuous oxide layer which completely covers each of the first level electrodes 38 and the other first level conductors. Once this layer of oxide 118 has been formed, a second layer of polycrystalline silicon is deposited onto the oxide layer to a thickness of 3000–8000 Angstroms (0.3–0.8 microns), and is then patterned using conventional photolithographic techniques to produce the desired pattern of second level gate electrodes 40 (FIG. 5J).

Figure 5J:
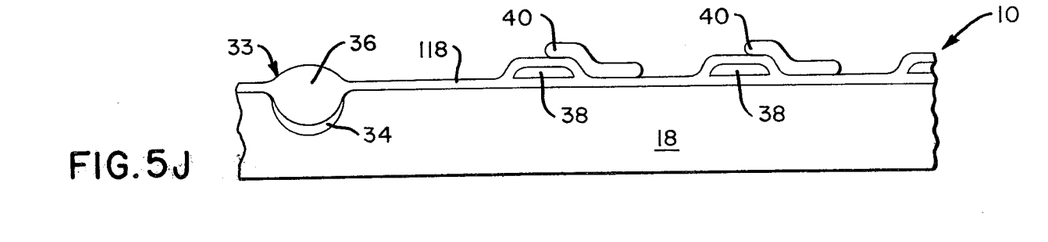

As shown in FIG. 5J, the second level gate electrodes 40 are constructed to have a slanted Z-shaped cross-section and are offset aligned relative to the first level gate electrodes 38 such that the upper horizontal portion of each electrode 40 overlaps a portion of its adjacent first level gate electrode 38.

Figure 5K:
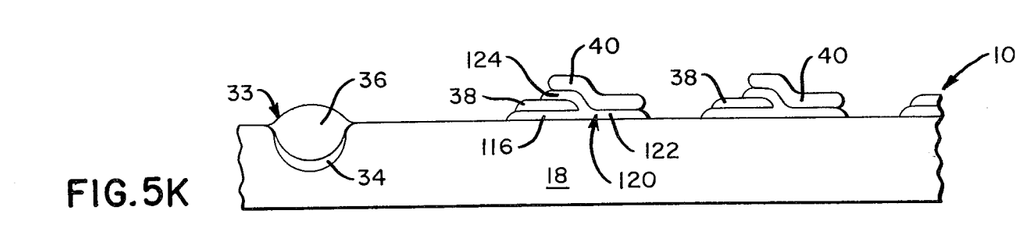

As shown in FIGS. 4K and 5K, the exposed portions of oxide layer 118 are now removed. The remaining portions 120 of oxide 118 comprise a section 122 between the substrate 18 and the second level gate electrodes 40 (FIG. 5K), a section 124 between the first and second level gate electrodes (FIG. 5K), and the sections such as 114 beneath the other first level conductors (FIG. 4K).

Figure 5L:
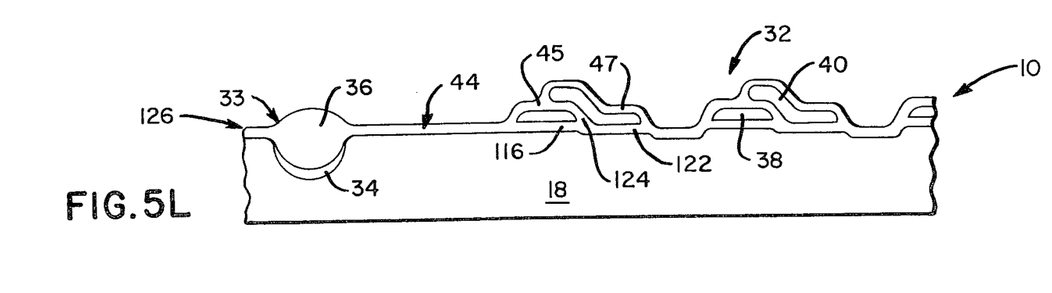

Then, using conventional techniques, a new layer of oxide having a thickness of 750–1000 Angstroms (0.075–0.1 microns) is deposited over the device as shown in FIGS. 4L and 5L. As this oxide layer is formed, it combines with the existing oxide to form a continuous layer 126 which covers the exposed portions of the substrate, and completely surrounds and separates the first and second level conductors. For example, the layer 126 includes (1) the oxide 114 and 116 between the substrate 18 and the first level conductors 30 (FIG. 4L) and 38 (FIG. 5L); (2) the oxide 122 (FIG. 5L) between the substrate and the second level gate conductors 40; and (3) the oxide sections 124 between the first and second level gate electrodes 38 and 40. Also, the oxide layer 126 includes new portion 45 which combines with the oxide sections 124 to completely cover the upper surface of the first level gate electrodes 38. Oxide layer 45 helps to isolate each of the first level gate electrodes from its adjacent second and third level electrodes. Finally, oxide layer 126 includes new portion 47 over the upper surface of the second level gate electrodes 40. This oxide portion 47 separates the second level gate electrodes 40 from the subsequently formed third level gate electrodes. For purposes of convenient reference, the designation 44 is given the portion of the oxide layer 126 which is within channel 32, and is located between the substrate 18 and the electrodes formed thereon, and separates the first, second and third level gate electrodes from the underlying substrate.

Figure 5M:
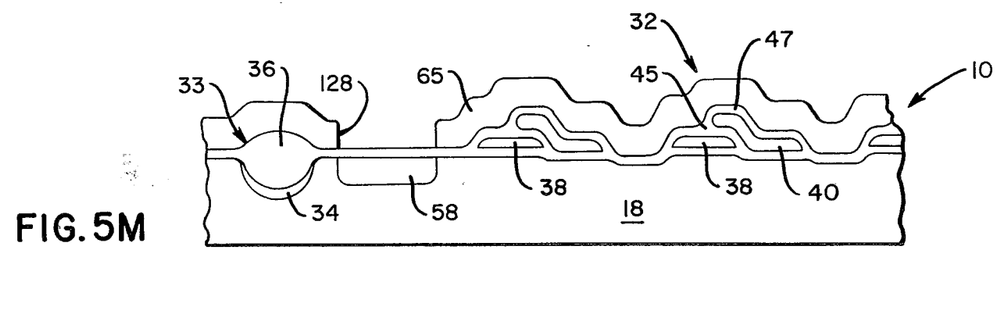

The next step of the disclosed fabrication process is illustrated in FIGS. 4M and 5M and comprises the implantation or diffusion of impurities into the substrate 18 to form CCD source 58 and the source and drain regions of the peripheral transistors 14 and 16. An exemplary technique for performing this step of the process includes the deposition of photoresist 65 over the structure of FIGS. 4L and 5L. The photoresist is then exposed to ultraviolet light through a mask and developed, i.e. selectively removed, to provide a window at each location where an impurity region is to be formed. One such window 128, FIG. 5M, is used in the formation of CCD source 58. Another such window 129, FIG. 4M, is used in the formation of source 22 of transistor 14. The impurity regions are formed by implanting or diffusing impurities into the substrate through the windows produced in the photoresist.

Next, the photoresist is removed and the interlayer insulator layer 62 is formed. As discussed below, this layer 62 is used to isolate the peripheral components and circuits, but is not required for CCD circuit 12, i.e., for the channel region 32.

Figure 5N:
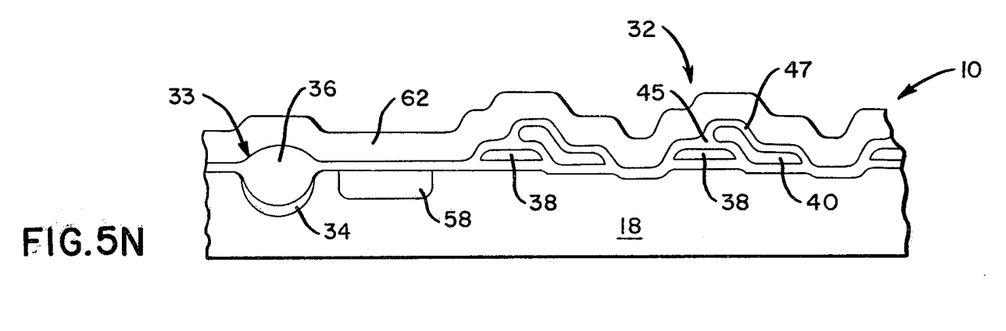

Initially, the interlayer insulator layer 62 is deposited onto the partially-completed device 10, as shown in FIGS. 4N and 5N, to cover the entire surface of the device. The layer 62 is a dielectric material and is similar to the protective overcoat which is commonly used as the last deposited insulator in conventional integrated-circuit fabrication processes. In particular, layer 62 is a dielectric such as silicon nitride or silicon dioxide or, preferably, densified CVD (chemical vapor deposited) silicon dioxide. The layer 62 is formed to a thickness which is adequate to electrically isolate the subsequently-formed conductor/interconnect layer from the underlying substrate and lower level conductors. Typically, this isolation function is achieved if the thickness of the layer 62 is approximately ten times the thickness of the gate oxide layer 44. For the preferred gate oxide 44 thickness of 500–1,000 Angstroms (0.05–0.10 microns), the thickness of the interlayer insulator layer 62 should be 5,000–10,000 Angstroms (0.5–1.0 microns). The exact thickness of the interlayer insulator layer 62 is determined by the circuit's operating environment and, in particular, by the voltage levels and frequencies. For example, the layer 62 likely will have to be relatively thick to prevent capacitive coupling problems if the circuit is to be operated at very high frequencies and/or subjected to very large transient voltages. Any departures from the 10:1 ratio will be readily determined by those skilled in the art based upon such circuit requirements.

Figure 5O:
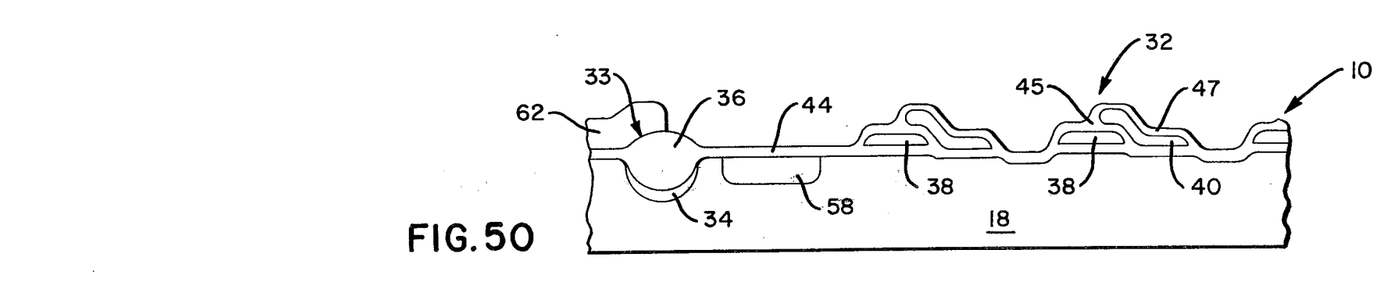

As shown in FIGS. 4O and 5O, conventional masking and etching techniques are used to selectively remove the interlayer insulator layer 62 down to the oxide 126 at the locations where the third level, electrode/interconnect layer will have gate electrodes. Within the CCD channel region 32, capacitive coupling, including interlevel coupling, is not a significant problem because of the arrangement of the three electrode levels. Thus, interlayer insulator 62 can be completely removed within channel 32. Outside the channel 32 it is best to remove the layer 62 only where a gate electrode is to be formed, in order to minimize interlevel coupling.

The structural organization of the device as shown in FIGS. 4O and 5O is representative of its shape at the conclusion of the process sequence described immediately above, irrespective of which dielectric material is used for layer 62. For instance, if silicon nitride is selected, the shape of the device is a direct outcome of the silicon nitride etch sequence, it being recognized that oxide layer 126 serves as an etchant stop. If, on the other hand, layer 62 is formed from silicon dioxide, the process follows the sequence of etching to the polycrystalline silicon electrode and monocrystalline silicon substrate surfaces followed by a regrowth of silicon dioxide to a depth consistent with the gate oxide requirements. This latter procedure was described with greater particularity earlier.

Figure 5P:
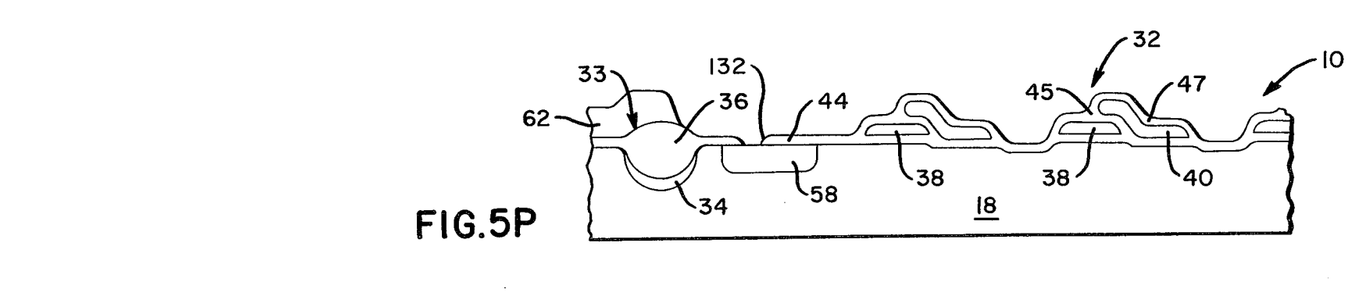

Contact holes such as 130 and 132 to the implanted regions and lower level electrodes and conductors are then made as shown in FIGS. 4P and 5P, respectively. It is also possible to cut the contact holes prior to patterning the interlayer insulator 62. Interchanging the interlayer insulator patterning and contact hole forming steps would allow all of the contact holes to be cut through the same materials and thicknesses. For example, cuts 130 and 132 would be through the same thickness of oxide.

Once the contact holes have been cut, a conductor layer of metal such as aluminum or aluminum-silicon is deposited onto the device of FIGS. 4P and 5P over the previously-formed oxide layer 44, lower level electrodes and conductors, and interlayer insulator layer 62. Thereafter, the deposited layer of metal is patterned using conventional photolithographic techniques to provide the desired interconnect and electrode pattern. In particular, the deposited layer of metal is patterned to provide the third level gate electrodes 42 (FIGS. 1 and 3), input gate 60 (FIGS. 1, 2 and 3), and other interconnect conductors such as conductor 63 (FIGS. 1 and 3). After metallization, a passivation coating (not shown) may be formed over the circuit 12.

From the foregoing, it can be seen that the subject invention discloses a method for effectively forming a multilevel CCD integrated circuit wherein the electrodes of the uppermost level can be formed by a single layer of metal which is used for interconnection and formation of electrodes. Also, the use of an interlayer insulator layer to insulate peripheral circuits is illustrated with respect to peripheral MOSFETs 14 and 16. Accordingly, it is readily apparent that this invention is one well adapted to attain all the ends and objects hereinabove set forth, together with other advantages which are obvious and inherent to the structure.

While the invention has been particularly shown and described with reference to preferred embodiments thereof, it will be understood by those skilled in the art that various changes in form and detail may be made therein without departing from the spirit and scope of the invention.

I claim:

1. An improved method of fabricating charge-coupled devices of the type having a channel in a semiconductor body separated by a layer of first dielectric material from an ordered arrangement of multiple overlapping electrodes, which electrodes are formed in a sequence of depositions and patterned removals, wherein the improved process comprises the steps of:

forming said layer of first dielectric material over said channel in said substrate;

depositing a layer of first electrode material over said layer of first dielectric material;

patterning said layer of first electrode material;

removing areas of exposed first dielectric material;

forming a layer of second dielectric material over said channel;

depositing a layer of second electrode material over said layer of second dielectric material;

patterning said layer of second electrode material;

depositing a layer of third dielectric material over said substrate, said layer being significantly thicker than said layers of first or second dielectric materials;

removing material from said layer of third dielectric material in the area of said channel so that the depth of dielectric material remaining is comparable to the depth of said first and second dielectric material layers;

depositing a layer of third electrode material over said substrate, said third material having significantly greater electrical conductivity than said first or second electrode materials; and patterning said layer of third electrode material over the surface of said substrate.

2. The improved process recited in claim 1, wherein the process includes the further steps of:

removing areas of exposed second dielectric material; and forming a layer of fourth dielectric material over said channel after the step of patterning said layer of second electrode material.

3. The improved processes recited in claim 1 or 2, wherein the depth of said layer of third dielectric material exceeds the depth of the other layers of dielectric materials by a factor in the range of 10.

4. The improved processes in claim 3, wherein said dielectric materials are silicon dioxide and said first and second electrode materials are conductively doped polycrystalline silicon.

5. The improved processes in claim 3, wherein said first, second and fourth dielectric materials are silicon dioxide, said third dielectric material is silicon nitride, and said first and second electrode materials are conductively doped polycrystalline silicon.

* * * * *